United States Patent [19]

Giakoumis

[11] Patent Number: 4,639,617
[45] Date of Patent: Jan. 27, 1987

[54] VARIABLE-BIAS CIRCUIT WITH HF TRANSMISSION PATH

[75] Inventor: Alex Giakoumis, Drancy, France

[73] Assignee: U.S. Philips Corporation, New York, N.Y.

[21] Appl. No.: 723,406

[22] Filed: Apr. 15, 1985

[30] Foreign Application Priority Data

Jun. 29, 1984 [FR] France .................. 84 10368

[51] Int. Cl.[4] ...................... H03K 3/01; H03K 3/353
[52] U.S. Cl. .................. 307/296 R; 307/320; 307/304
[58] Field of Search .............. 307/296 R, 475, 491, 307/501, 493, 568, 572, 552, 490, 443, 297, 475, 320, 304; 330/278, 279, 284, 285, 296, 307

[56] References Cited

U.S. PATENT DOCUMENTS 3,539,834 11/1970 Stopper ............................ 307/297
3,621,284 11/1971 Cluett .............................. 307/568

OTHER PUBLICATIONS

Radio and Television Engineer's Reference Book, pp. I48–I63.

Primary Examiner—Stanley D. Miller
Assistant Examiner—T. Q. Phan
Attorney, Agent, or Firm—Thomas A. Briody; William J. Streeter; Leroy Eason

[57] ABSTRACT

On an output terminal (12) of a variable-bias circuit with an HF transmission path a bias voltage (Vo) is produced which is variable in response to variations of a d.c. control voltage (Vc) applied to a control terminal (13). The circuit transmits an HF signal from an input terminal (14) to the output terminal (12) with a low attenuation. In accordance with the invention this circuit comprises a field-effect transistor (11) whose source (S1) is driven by a constant-current generator (22) and is connected to the output terminal (12), the grate (G1) of the transistor (11) being connected to the control terminal (13) by a resistor (R1) and to the source (S1) of the transistor (11) by a capacitive element (16).

4 Claims, 4 Drawing Figures

VARIABLE-BIAS CIRCUIT WITH HF TRANSMISSION PATH

The invention relates to a variable-bias circuit with an HF transmission path, having an output terminal on which a variable-bias voltage is produced in response to variations of a d.c. control voltage applied to a control terminal, which circuit transmits an HF signal from an input terminal to the output terminal with a low attenuation, said input terminal and output terminal being interconnected by a decoupling capacitor.

A circuit of the type defined in the opening paragraph is described in "Radio and Television Engineers' Reference Book", pages I-48 and I-63. In addition to the decoupling capacitor this circuit comprises a coil having high inductance which connects the control terminal to the output terminal. In this conventional circuit the d.c. control voltage is applied directly to the output terminal, because the coil has a negligible impedance. However, during HF operation the capacitor and the coil have a very low and a very high impedance, respectively so that the HF signal is transmitted from the input terminal to the output terminal without being attenuated. However, this known type of circuit has the disadvantage that it is not easy to integrate because the capacitor and the coil demand a substantial surface area, which leads to a substantial increase in cost.

It is the object of the present invention to mitigate this drawback and to provide a variable-bias circuit with an HF transmission path which is easy to integrate on a small surface area.

In accordance with the invention a variable-bias circuit with an HF transmission path, having an output terminal on which a variable bias voltage is produced in response to variations of a d.c. control voltage applied to a control terminal, which circuit transmits an HF signal from an input terminal to the output terminal with a low attenuation, said input terminal and output terminal being interconnected by a decoupling capacitor, is characterized in that it comprises a first field-effect transistor whose source is driven by a constant-current generator and is connected to the output terminal, the gate of the transistor being connected to the control terminal via a resistor and to the source of the transistor via a capacitive element.

Thus, as will be described in more detail hereinafter, the field-effect transistor operates with a constant drain-source current, which corresponds to operation with a constant gate-source voltage if the drain-source voltage is sufficiently high, typically higher than 1 V. Since the voltage applied to the gate is substantially equal to the d.c. control voltage, the bias voltage at the output is a linear function of the control voltage and thus follows the variations of this control voltage. For high frequencies the capacitive element constitutes a short-circuit between the gate and the source of the field-effect transistor, which then operates with a gate-source alternating voltage of zero volts so that the transistor has a high output impedance. Since the resistor itself has a high value, the circuit in accordance with the invention transmits the HF signal without or with only a very low attenuation.

In a suitable embodiment of the invention the constant-current generator comprises a second field-effect transistor whose drain-source current remains substantially constant during variations of the d.c. control voltage.

Since the circuit in accordance with the invention in principle comprises two field-effect transistors, it may be integrated on a small surface area, in particular if the capacitive element is constituted by a reverse-biased diode.

Embodiments of the invention will now be described in more detail, by way of example, with reference to the accompanying drawings. In the drawings FIG. 1 shows schematically a variable-bias circuit with HF transmission path in accordance with the invention.

Figure 1:
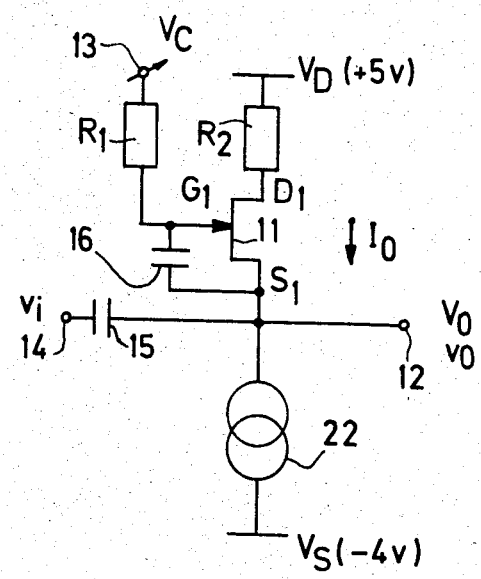

FIG. 1 shows a variable-bias circuit with HF transmission path, comprising an output terminal 12 on which a voltage Vo appears which is variable in response to variations of a d.c. control voltage Vc applied to a control terminal 13. This circuit transmits an HF signal from an input terminal 14 to the output terminal 12 with a low attenuation, said input terminal and output terminal being interconnected by a decoupling capacitor 15. As can be seen in FIG. 1, the circuit in accordance with the invention comprises a first field-effect transistor whose source S1 is driven by a constant-current generator 22 and is connected to the output terminal 12. Further, the gate G1 of transistor 11 is connected to the control terminal 13 via a resistor R1 and to the source S1 of transistor 11 by a capacitive element 16.

As the gate current of transistor 11 is of the order of some nanoamperes, the voltage drop across the resistor R1 (with a value of some tens of kiloohms) is negligible, so that $$VG1 = Vc.$$

The bias voltage Vo on the output terminal 12 is therefore $$VO = Vc - (V_{GS})_1 \quad (1).$$

Figure 2:
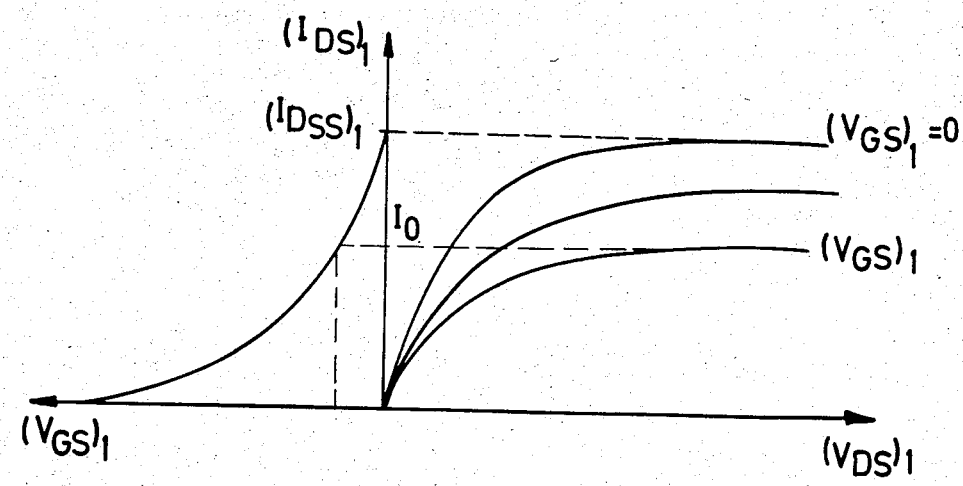
FIG. 2 is a diagram illustrating the operation of the circuit shown in FIG. 1.
Figure 4:
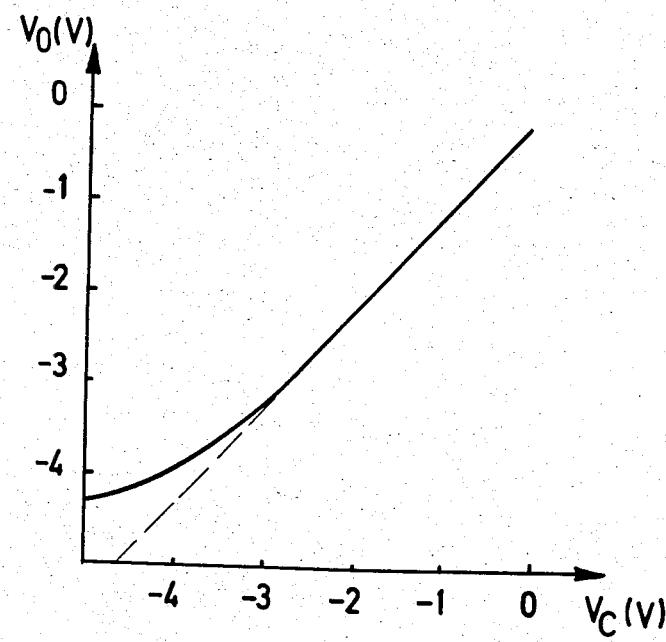
FIG. 4 is a graph representing the variation of the variable voltage as a function of the control voltage.

Io is the current impressed by the current generator 22. FIG. 2 shows that the voltage $(V_{GS})_1$ of transistor 11 is substantially constant for sufficiently high values of $(V_{DS})_1$, typically a few volts. The relationship (1) between the voltages Vo and Vc is therefore linear. In particular, if the current supplied by the current generator 22 is the maximum current $(I_{DSS})_1$ of transistor 11 $(V_{GS})_1$ is zero and $$Vo = Vc \quad (2)$$

so that the bias voltage Vo follows the variations of the control voltage Vc exactly, at least within a certain range, as can be seen in the graph of FIG. 4.

Figure 3:
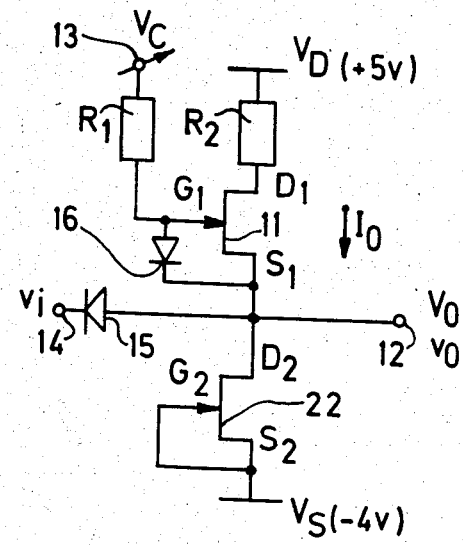
FIG. 3 is a circuit diagram of a practical embodiment of the circuit shown in FIG. 1.

FIG. 3 shows a circuit in accordance with the invention in which the constant-current generator 22 comprises a second field-effect transistor. As is shown in the example of FIG. 3, this second transistor 22 operates with a $(V_{GS})_2 = 0$. Consequently, for a sufficiently high voltage $((V_{DS})_2 > 1 \text{ V})$, the current $(I_{DS})_2$ between the drain D2 and the source S2 remains substantially constant and is equal to $(I_{DSS})_2$ during variations of the d.c. control voltage Vc. It is evident that in this case the first field-effect transistor 11 should handle at least the current $(I_{DSS})_2$ of the second transistor 22 and hence that $$(I_{DSS})_2 \leq (I_{DSS})_1$$

Equal currents are obtained when the two transistors are identical. If they are not identical, the channel width of the first field-effect transistor 11 should be at least equal to the channel width of the second field-effect transistor 22 in the case of equal channel lengths.

In the embodiments shown in FIGS. 1 and 3 a limiting resistor $R_2$ is connected to the drain $D_1$ of the first transistor 11.

For the HF signal vi applied to the input terminal 14 the capacitive element 16 has a very low impedance and behaves as a short circuit, so that the admittance of the circuit is $$Y = (g_{ds})_1 + \frac{1}{\frac{1}{(g_{ds})_2} + R2} + \frac{1}{R1}$$

$$\text{where } g_{ds} = \left(\frac{\partial i_{ds}}{\partial v_{ds}}\right) v_{gs} = \text{constant}$$

The advantage of the circuit in accordance with the invention is that the two field-effect transistors operate with a $V_{gs}$=constant=0, which for sufficiently high values of $V_{DS}$ results in low admittances $g_{ds}$. For gallium-arsenide field-effect transistors having a channel width of 10 μm, $1/g_{ds}$ is of the order of 12 kΩ. If R1>50 kΩ and R2=600 Ω, the impedance of the circuit will be approximately 6 kΩ. Thus, when the circuit to which the variable bias voltage is to be applied has an input impedance of the order of 6 kΩ, the output signal vo is substantially equal to the input signal vi.

An advantage of the circuit in accordance with the invention is that it can be integrated very easily on a comparatively small surface area. For this purpose, as can be seen in FIG. 3, the capacitive element 16, like the capacitor 15, is constituted by for example a reverse-biased Schottky diode formed in the same way as the gates of the transistors.

Another advantage of the circuit in accordance with the invention is that it has a very low power consumption.

Suitable values for $(V_{DS})_1$ and $(V_{DS})_2$ are obtained by applying, for example, to the terminals of the circuit bias voltage $V_D$ and $V_S$ of the order of +5 V and −4 V, respectively for variations of 3 V of the d.c. control voltage Vc.

What is claimed is:

1. A variable-bias circuit with an HF transmission path, having an output terminal (12) on which a variable bias voltage (Vo) is produced in response to variations of a d.c. control voltage (Vc) applied to a control terminal (13), which variable-bias circuit transmits an HF signal from an input terminal (14) to the output terminal (12) with a low attenuation, said input terminal and output terminal being interconnected by a decoupling capacitor (15), characterized in that said variable-bias circuit comprises a first field-effect transistor (11) whose source (S1) is driven by a constant-current generator (22) and is connected to the output terminal (12), the gate (G1) of the transistor (11) being connected to the control terminal (13) via a resistor (R1) and to the source (S1) of the transistor (11) via a capacitive element (16).

2. A circuit as claimed in claim 1, characterized in that the constant-current generator (22) comprises a second field-effect transistor whose current $((I_{DS})_2)$ between the drain (D2) and the source (S2) remains substantially constant during variations of the d.c. control voltage (Vc).

3. A circuit as claimed in claim 2, characterized in that in the case of equal channel lengths the channel width of the first field-effect transistor (11) is at least equal to the channel width the second field-effect transistor (22).

4. A circuit as claimed in any one of the claims 1 to 3, characterized in that the capacitive element (16) is constituted by a reverse-biased diode.

* * * * *